(12) United States Patent
Schnetter

(10) Patent No.: US 12,429,535 B2
(45) Date of Patent: Sep. 30, 2025

(54) METHOD FOR OPERATING AN MRI SYSTEM, AN MRI SYSTEM, A CONTROL UNIT, A STORAGE UNIT, A COMPUTER PROGRAM, AND AN ELECTRONICALLY READABLE DATA CARRIER

(71) Applicant: Siemens Healthcare GmbH, Erlangen (DE)

(72) Inventor: Volker Schnetter, Nuremberg (DE)

(73) Assignee: Siemens Healthineers AG, Forchheim (DE)

( * ) Notice: Subject to any disclaimer, the term of this patent is extended or adjusted under 35 U.S.C. 154(b) by 142 days.

(21) Appl. No.: 18/519,631

(22) Filed: Nov. 27, 2023

(65) Prior Publication Data
US 2024/0201289 A1    Jun. 20, 2024

(30) Foreign Application Priority Data
Dec. 15, 2022   (DE) .................... 10 2022 213 701.9

(51) Int. Cl.
G01R 33/28         (2006.01)
(52) U.S. Cl.
CPC .................. G01R 33/288 (2013.01)
(58) Field of Classification Search
None
See application file for complete search history.

(56) References Cited

U.S. PATENT DOCUMENTS

| | | | |
|---|---|---|---|
| 7,282,914 B2* | 10/2007 | Morich | A61B 5/055 |
| | | | 324/318 |
| 11,079,449 B2* | 8/2021 | Shen | G01R 33/543 |
| 11,331,050 B2* | 5/2022 | Tanoue | A61B 5/742 |
| 2003/0098687 A1 | 5/2003 | Arneth | |
| 2025/0060432 A1* | 2/2025 | Schnetter | G16H 40/40 |

FOREIGN PATENT DOCUMENTS

DE           10150137 A1     5/2003

* cited by examiner

*Primary Examiner* — Rodney E Fuller
(74) *Attorney, Agent, or Firm* — Lempia Summerfield Katz LLC

(57) ABSTRACT

A method performed by an MRI system includes: receiving at least one object parameter value of an object to be examined in accordance with a predefined MRI protocol; determining a frequency distribution of deposition values of examined objects, each having the at least one object parameter value, from available MRI examination datasets; determining, by a control unit of the MRI system, a reference deposition value of the examined objects, each having the at least one object parameter value, from the frequency distribution of the deposition values of the examined objects, each having the at least one object parameter value, for a predefined reference proportion in accordance with a predefined reference determining procedure; and determining, as a function of the reference deposition value, at least one MRI protocol parameter of the predefined MRI protocol for examining the object to be examined, in accordance with a predefined MRI protocol optimization procedure.

15 Claims, 3 Drawing Sheets

S1 - Receive at least one object parameter value

S2 - Read MRI examination datasets

S3 - Determine distribution function of deposition values

S4 - Determine inverse distribution function

S5 - Receive predefined reference proportion

S6 - Determine at least one MRI protocol parameter

S7 - Set MRI protocol

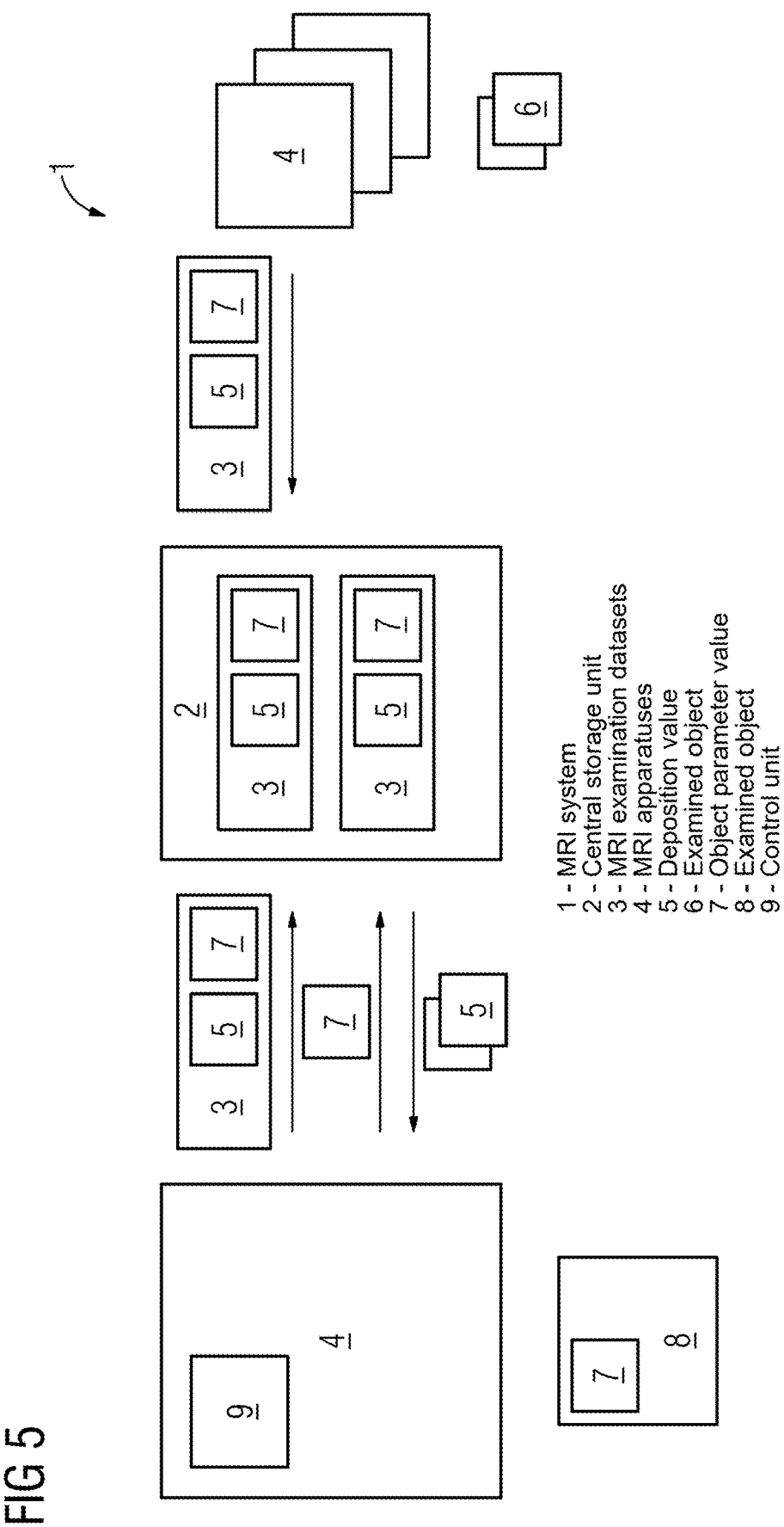

METHOD FOR OPERATING AN MRI SYSTEM, AN MRI SYSTEM, A CONTROL UNIT, A STORAGE UNIT, A COMPUTER PROGRAM, AND AN ELECTRONICALLY READABLE DATA CARRIER

The present patent document claims the benefit of German Patent Application No. 10 2022 213 701.9, filed Dec. 15, 2022, which is hereby incorporated by reference in its entirety.

TECHNICAL FIELD

The disclosure relates to a method for operating an MRI system, an MRI system, a control unit, and a storage unit. The disclosure also relates to a corresponding computer program and an electronically readable data carrier.

BACKGROUND

Standards for MRI examinations specify that the averaged specific absorption rate (SAR) must remain below a specified limit value within a predefined time interval in order to prevent injury to the patient due to overheating.

The specific absorption rate averaged over the patient's entire body, the so-called whole-body SAR, is determined prior to the actual measurement by dividing the expected power absorbed in the patient by the patient mass.

For this purpose, in the so-called adjustment, a preliminary examination carried out prior to the actual examination, a reference pulse is injected into a transmit system of an MRI apparatus, the amplitude of which is increased until the reference field strength B1+ corresponding to a defined flip angle may be determined by the MRI apparatus. This amplitude is used to scale the pulses to be played out by an MRI protocol that defines the specific timing of the activation. From this, the average power to be delivered by the transmit system may be predetermined. The residual power loss in the transmit coil is subtracted from this transmitted power to determine the active power absorbed in the patient. Dividing by the patient mass provides the whole-body SAR.

It should be noted that the power—and therefore the SAR—required for the reference pulse depends on the patient's constitution.

When creating the MRI protocol, the MRI protocol parameters of the MRI protocol are set in accordance with a predefined MRI protocol optimization procedure such that an optimal image is obtained. The number of slices, examination time and flip angle in particular have a significant influence on the required average $B1+^2$, which in turn determines the required SAR. The resulting image may be checked using volunteers or by simulation data. During operation, however, patients may be examined for whom a higher power is provided in order to generate the reference pulse of the specified flip angle. In this case, the higher power also results in a higher SAR value. As the SAR value for providing the reference pulse is used as the reference deposition value for configuring the MRI protocol, this means that the SAR value predicted for the MRI protocol to be run is also higher.

The SAR value determined for the MRI protocol may be higher than the permissible limit value described above. To enable the examination to be initiated or continued in accordance with the MRI protocol, the MRI apparatus determines possible adjustments to the MRI protocol parameters that will enable the MRI protocol to be carried out in compliance with the permissible limit value. The possible adjustments are suggested to an operator of the MRI apparatus. The operator may then select a desired adjustment. However, the disadvantage of this is that the determination and selection of the possible adjustments interrupts a workflow. The time involved means that fewer patients may be examined.

According to the current state of the art, it is common practice to set the parameters of the MRI protocols based on examinations of randomly selected volunteers or using simulation data.

To provide that these MRI protocols may be performed without interruptions because of a predicted exceedance of the SAR limit value, the MRI protocol parameters are selected in such a way that the limit values will not be exceeded under any circumstances, i.e., a relatively large safety margin is built in.

However, as it is not yet known to what extent the patients to be examined will deviate from the volunteer subject or simulation values, it is possible that this safety margin may be too large or too small. In the first case, image quality or shorter measurement time or higher resolution would be sacrificed, and in the second case, the workflow would have to be interrupted in order to make appropriate adjustments to the MRI protocol to bring the SAR value below the permissible limit.

SUMMARY AND DESCRIPTION

The object of the disclosure is to create a method which makes it possible to optimize MRI protocols in such a way that it is possible to determine in advance for which patients an examination to be performed in accordance with an MRI protocol may be carried out without interruption and/or changing MRI protocol parameters of the MRI protocol.

The scope of the present disclosure is defined solely by the appended claims and is not affected to any degree by the statements within this summary. The present embodiments may obviate one or more of the drawbacks or limitations in the related art.

A first aspect relates to a method for operating an MRI system including at least one control unit.

The acts described may be performed by the at least one control unit or a plurality of the control units of the MRI system.

In a first act, an MRI system receives at least one object parameter value of an object to be examined in an MRI examination in accordance with a predefined MRI protocol. The object parameter value may be received by the control unit of the MRI system. The object to be examined may be an object or a patient. The object parameter value may include a mass, a material composition of the object, or parameters of the object in general, which may influence deposition in the object in the MRI examination.

The object may be examined in accordance with an MRI examination method. The MRI examination to be performed may be described in a predefined MRI protocol. The MRI protocol may define pulse sequences that may be delivered by an MRI apparatus during the MRI examination. The predefined MRI protocol may have MRI protocol parameters that may be static or adjustable. In order to be able to provide compliance with at least one specification of deposition values, (e.g., compliance with SAR limit values in the MRI examination), at least one of the MRI protocol parameters of the specified MRI protocol may be adjusted or determined in a predefined MRI protocol optimization procedure.

The MRI protocol may be provided to define the MRI examination of the object to be examined by an MRI apparatus. The MRI protocol may include at least one MRI protocol parameter, wherein the MRI protocol parameter may be a flip angle to be produced by the MRI apparatus during the MRI examination, for example.

The adjustment may involve changing the flip angle to be produced during the MRI examination in accordance with the specified MRI protocol. For example, the flip angle may be reduced as a function of the deposition value in order to provide compliance with deposition limits if, due to the material composition thereof, the object absorbs more power during MRI examinations and thus has a larger than assumed deposition value.

The at least one MRI protocol parameter may be determined as a function of a reference deposition value. In the prior art, the reference deposition value may include a deposition value obtained for the object, which value may have been determined in the prescan prior to the MRI examination. The reference deposition value may include a SAR reference value that may be used as a reference for determining the at least one MRI protocol parameter in accordance with the predefined MRI protocol optimization procedure.

The following acts are provided for determining the reference deposition value for the predefined MRI protocol optimization procedure in order to provide an MRI protocol optimized for the object to be examined.

In one act of the method, the MRI system generates, from MRI examination datasets, a frequency distribution of deposition values of examined objects that include the at least one object parameter value. The frequency distribution may be generated by the control unit, for example. In other words, the frequency distribution of the deposition values of the examined objects is determined. The frequency distribution describes a respective number of the respective deposition values that were determined for the objects examined in a previous MRI examination that have the at least one object parameter value. The deposition values relate to the examined objects that have the at least one object parameter value. The at least one object parameter value may relate to a particular weight value of the examined object or a particular range of values of the weights of the examined objects. In other words, the frequency distribution relates to the objects that have already been examined and that have the at least one object parameter value. For example, the frequency distribution may describe which deposition values were determined in which number for examined objects of a weight of 80 kg in previous examinations.

The deposition values of the examined objects may include whole-body SAR values, partial-body SAR values, B1+RMS values, B1^2 values or B1+^2 values, which were determined in the respective previous MRI examination for the respective examined objects. The respective value of the deposition values may have been determined, for example, during a so-called prescan of the MRI examination or during the performance of a main scan of the MRI examination for the respective examined object.

The respective deposition values of the examined objects may be stored together with the at least one object parameter value of the respective examined object in a respective MRI examination dataset of the examined object. In other words, the frequency distribution is determined based on MRI examination datasets that include the respective deposition values and the respective at least one object parameter value of the objects already examined. The MRI examination datasets may have been generated by the MRI system in respective MRI examination procedures. The MRI examination datasets may be stored in a central storage unit of the MRI system. The control unit may be configured to retrieve the corresponding MRI examination datasets and/or the corresponding deposition values from the central storage unit.

In an act, a reference deposition value of the examined objects, each having the at least one object parameter value, is determined by the control unit of the MRI system from the frequency distribution of the deposition values of the examined objects, which each have the at least one object parameter value, for a predefined reference proportion in accordance with a predefined reference determining procedure.

In other words, the reference deposition value, which is intended for use in the predefined MRI protocol optimization procedure, is determined by the control unit of the MRI system in accordance with a predefined reference determining procedure. The frequency distribution and the reference proportion are specified as the basis for the determination. The frequency distribution only includes those of the examined objects that have the at least one object parameter value. The reference proportion may specify a proportion of the examined objects whose deposition values do not exceed the reference deposition value to be determined. The specified reference determining procedure may include a prior art statistical or analytical method.

In a subsequent act, the at least one MRI protocol parameter of the MRI protocol for examining the object to be examined, having the at least one object parameter value, is determined by the control unit of the MRI system as a function of the reference deposition value in accordance with the predefined MRI protocol optimization procedure.

In other words, the at least one MRI protocol parameter of the MRI protocol is generated in accordance with the known prior art MRI protocol optimization procedure.

In contrast to the prior art, it is therefore provided to determine the reference deposition value for the MRI protocol optimization procedure as a function of the at least one object parameter value of the object on the basis of existing examination datasets.

The disclosure advantageously provides that that the MRI protocol optimization procedure is based on experimentally determined deposition values, wherein the at least one object parameter value of the object to be examined is taken into account.

The disclosure also includes developments resulting in further advantages.

In certain examples, the predefined reference determining procedure includes the following acts to be performed by the control unit of the MRI system.

In one act of the predefined reference determining procedure, a distribution function of the deposition values of the examined objects of the at least one object parameter value is determined from the frequency distribution. In other words, the distribution function is determined by the MRI system from the frequency distribution. The act may be performed by the control unit. The distribution function describes a distribution of the deposition values of the objects already examined which have the at least one object parameter value. The distribution function indicates which proportion of the examined objects has a deposition value that is less than or equal to a predefined deposition value.

In a subsequent act, an inverse distribution function of the distribution function is determined, wherein the inverse distribution function assigns to a specific proportion of the examined objects a specific largest deposition value at which the distribution function of the deposition values exceeds the specific proportion. The largest deposition value may be the smallest possible maximum deposition value. The largest deposition value may describe the following: for a proportion n of 90% of the population, the maximum SAR occurring is 5 W/kg. At 95% of the population, the maximum SAR may be 6 W/kg. The act may be performed by the control unit. In other words, the inverse distribution function is generated by the MRI system from the distribution function of the deposition values. The inverse distribution function describes the largest deposition value that may occur for a given proportion of the examined objects.

In a subsequent act, the largest deposition value for a predefined reference proportion of the objects is determined by the inverse distribution function. In other words, the predefined reference proportion of the objects is specified, which has a deposition value that shall be less than or equal to the largest deposition value to be determined. The largest deposition value is determined for the predefined reference proportion by the inverse distribution function. For example, the predefined reference proportion may specify that the largest deposition value is determined in such a way that 99% of the objects have a deposition value that is less than or equal to the largest deposition value.

The largest deposition value determined by the inverse distribution function is provided as the reference deposition value in the MRI protocol optimization procedure.

In certain examples, the deposition value describes a SAR value. In other words, the deposition value is the SAR value for providing the reference pulse.

In certain examples, the deposition value describes a B1+^2 value. In other words, the deposition value describes the square of the reference field strength B1+ that corresponds to a defined flip angle.

In certain examples, the at least one object parameter value includes the object mass. In other words, the reference deposition value is determined as a function of the mass of the object to be examined. For example, the MRI examination datasets may include the respective value of the mass of the respective examined object. The advantage of this development is that the influence of the object mass on the deposition value is taken into account.

In certain examples, the at least one object parameter value includes a position of the examination region of the object. In other words, the reference deposition value is determined as a function of the position of the examination region of the object. The examination region may describe an organ of the object, for example, a heart or brain of the object.

In certain examples, the predefined reference proportion is received by the control unit of the MRI system. In other words, the predefined reference proportion required to determine the largest deposition value is received by the control unit. The predefined reference proportion may be supplied to the MRI system by a user interface in dependence on a user input.

In certain examples, the deposition values of the examined objects having the at least one object parameter value is retrieved from a storage unit of the MRI system by the control unit of the MRI system. In other words, the MRI examination datasets are provided by a storage unit from which the MRI examination datasets are retrieved by the control unit. The storage unit may be configured as a central server for centrally providing the MRI examination datasets to control units of respective MRI apparatuses, for example.

In certain examples, the object to be examined is examined by the MRI system in accordance with the determined MRI protocol. In other words, the MRI system is configured to use the determined MRI protocol to examine the object to be examined in accordance with the MRI protocol.

In certain examples, the method involves activating an MRI apparatus by the control unit to examine the object to be examined by the MRI apparatus in accordance with the MRI protocol. In other words, the object to be examined is examined in the MRI examination in accordance with the MRI protocol. The examination is performed by an MRI apparatus which is controlled by the control unit.

In certain examples, the method involves determining the respective deposition value of the respective object to be examined. The deposition value may be determined in the MRI examination of the object to be examined by the MRI apparatus. The respective deposition value and the respective object parameter value are assigned to the respective MRI examination dataset t by the control unit. The MRI examination dataset is transmitted to the storage unit by the control unit. The provision of new MRI examination datasets enables the accuracy of the method to be improved by further MRI examinations.

A second aspect relates to an MRI system.

The MRI system is configured to receive at least one object parameter value of an object to be examined in an MRI examination in accordance with a predefined MRI protocol. The MRI system is configured to determine, from MRI examination datasets, a frequency distribution of deposition values of examined objects having the at least one object parameter value. A respective one of the MRI examination datasets includes the respective deposition value and the respective object parameter value of the respective examined object. The MRI system is configured to determine, from the frequency distribution, a distribution function of the deposition values of the examined objects having the at least one object parameter value of the objects. The MRI system is configured to determine an inverse distribution function of the distribution function, wherein the inverse distribution function assigns a largest deposition value to a proportion of the examined objects at which the distribution function of the deposition values exceeds the proportion. The MRI system is configured to determine the largest deposition value for a given reference proportion by the inverse distribution function. The MRI system is configured to determine at least one MRI protocol parameter of an MRI protocol for examining the object to be examined having the object parameter value in accordance with a predefined MRI protocol optimization procedure. The largest deposition value is predetermined as the reference deposition value in the MRI protocol optimization procedure.

A third aspect relates to a control unit of an MRI system.

The control unit may include at least one computing unit.

In particular, a computing unit may refer to a data processing device including a processing circuit. The computing unit may therefore process data to perform computing operations. This may also include operations to perform indexed accesses to an examination data structure, for example, a look-up table (LUT).

In particular, the computing unit may include one or more computers, one or more microcontrollers, and/or one or more integrated circuits, for example, one or more ASICs (application-specific integrated circuits), one or more FPGAs (field-programmable gate arrays), and/or one or more SoCs (systems-on-a-chip). The computing unit may also include one or more processors, for example, one or more microprocessors, one or more CPUs (central processing units), one or more GPUs (graphics processing units), and/or one or more signal processors, in particular one or more DSPs (digital signal processors). The computing unit may also include a physical or virtual network of computers or other such units.

In various exemplary embodiments, the computing unit includes one or more hardware and/or software interfaces and/or one or more storage units.

A storage unit may be implemented as volatile examination data memory, for example, DRAM (dynamic random access memory) or SRAM (static random access memory), or as non-volatile examination data memory, for example, ROM (read-only memory), PROM (programmable read-only memory), EPROM (erasable programmable read-only memory), EEPROM (electrically erasable programmable read-only memory), as flash memory or flash EEPROM, as FRAM (ferroelectric random access memory), as MRAM (magnetoresistive random access memory), or as PCRAM (phase-change random access memory).

A fourth aspect relates to a storage unit of an MRI system.

According to a fifth aspect, a computer program including instructions is provided. When the computer program is executed by an imaging apparatus, (e.g., the at least one computing unit), the instructions cause the imaging apparatus to carry out an imaging method as disclosed herein.

According to a sixth aspect, a computer-readable storage medium is provided that stores a computer program.

The computer program and the computer-readable storage medium may be understood as corresponding computer program products including the instructions.

Further features of the disclosure emerge from the claims, the figures, and the description of the figures. The features and combinations of features mentioned above in the description and the features and combinations of features mentioned below in the description of the figures and/or shown in the figures may be included in the disclosure not only in the combination indicated in each case, but also in other combinations. In particular, the disclosure may also include embodiments and combinations of features that do not have all the features of an originally formulated claim. In addition, the disclosure may include embodiments and combinations of features which go beyond or deviate from the combinations of features set forth in the references of the claims.

The disclosure is now explained in greater detail with reference to specific embodiments and associated schematic drawings. In the figures, identical or functionally identical elements may be provided with the same reference characters. The description of identical or functionally identical elements may not necessarily be repeated with respect to different figures.

BRIEF DESCRIPTION OF THE DRAWINGS

FIG. 5 schematically illustrates an example of an MRI system.

DETAILED DESCRIPTION

Figure 1:
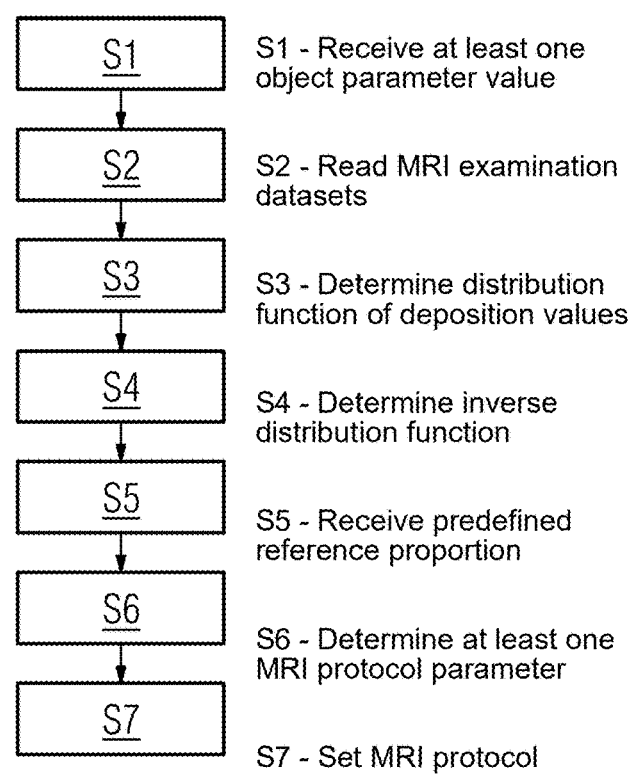
FIG. 1 schematically illustrates an example of a method for operating an MRI system.

FIG. 1 shows a schematic representation of a method for operating an MRI system.

In act S1, for example, at least one object parameter value 7 of an object 8 to be examined in an MRI examination in accordance with a predefined MRI protocol may be received by a control unit 9 of the MRI system 1.

Figure 2:
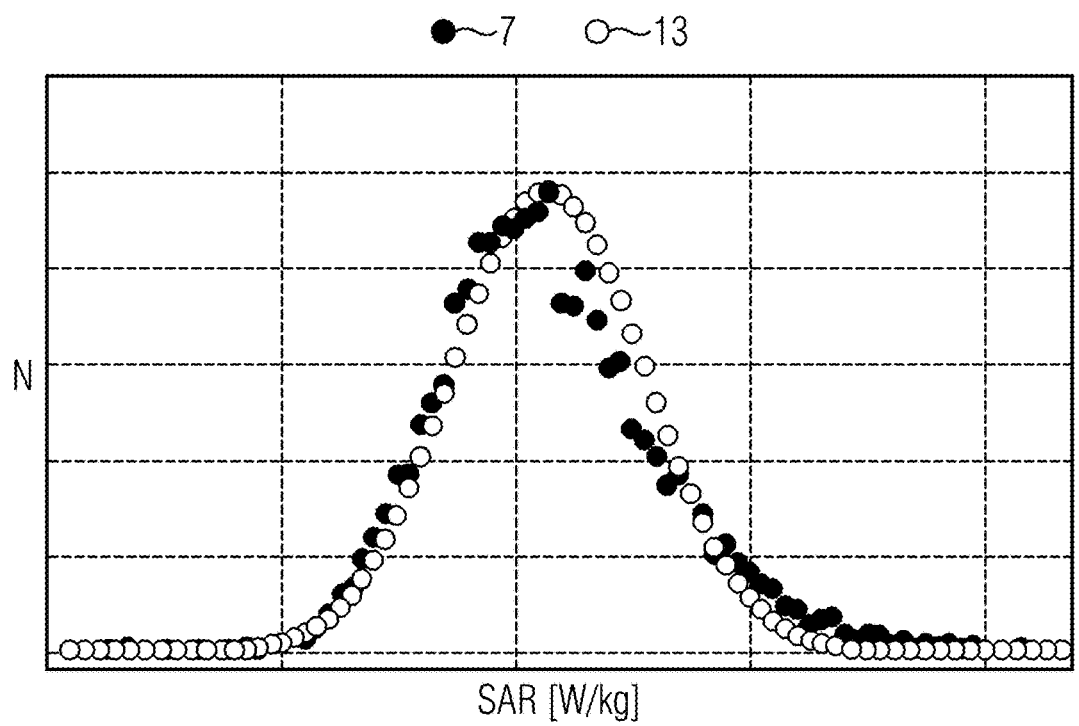
FIG. 2 schematically illustrates an example of a frequency distribution.

In act S2, MRI examination datasets 3 may be read by the MRI system 1. A respective one of the MRI examination datasets 3 may include a respective deposition value 5 and the respective at least one object parameter value 7 of the respective examined object 6. The respective deposition value 5 may have been determined in a respective MRI examination procedure on the respective examined object 6. The respective at least one object parameter value 7 of the respective examined object 6 and the respective deposition value 5 may have been stored by the performing MRI apparatus 4 in a storage unit 2 which may be provided for storing the MRI examination datasets 3. The storage unit 2 may be a memory of the control unit 9 of the MRI system 1. The storage unit 2 may also be configured as a central storage unit 2 that may be accessed by MRI apparatuses 4 and/or the control unit 9 via an Internet connection or a network connection in order to retrieve MRI examination datasets 3 and/or deposition values 5 or to provide MRI examination datasets 3. The control unit 9 or the storage unit 2 may determine which of the MRI examination datasets 3 contain the predetermined object parameter value 7. For example, the control unit 9 or the storage unit 2 may retrieve the deposition values 5 of the MRI examination datasets 3, which may contain the object parameter value 7 that corresponds to the predefined object parameter value 7 or lies within a predefined value range around the object parameter value 7. A plurality of object parameter values 7 of the object 8 to be examined for which the respective deposition values 5 are to be retrieved may also be predefined. For example, if the predefined object parameter values 7 include an examination region and a weight value, the control unit 9 may simultaneously retrieve the deposition values 5 of the MRI examination datasets 3 that have the predefined weight value and the predefined examination region. For example, the deposition values 5 of all the MRI examination datasets 3 that have the specified weight value of 80 kg, and the examination "heart" may be retrieved. From the determined deposition values 5, the control unit 9 may determine a frequency distribution of the deposition values 5 that may describe the distribution of the deposition values 5 as acquired for already examined objects 6 having the at least one predefined object parameter value 7. The frequency distribution may specify a respective number N of occurrences of the deposition value 5 for each of the deposition values 5. An example of a frequency distribution is shown in FIG. 2.

Figure 3:
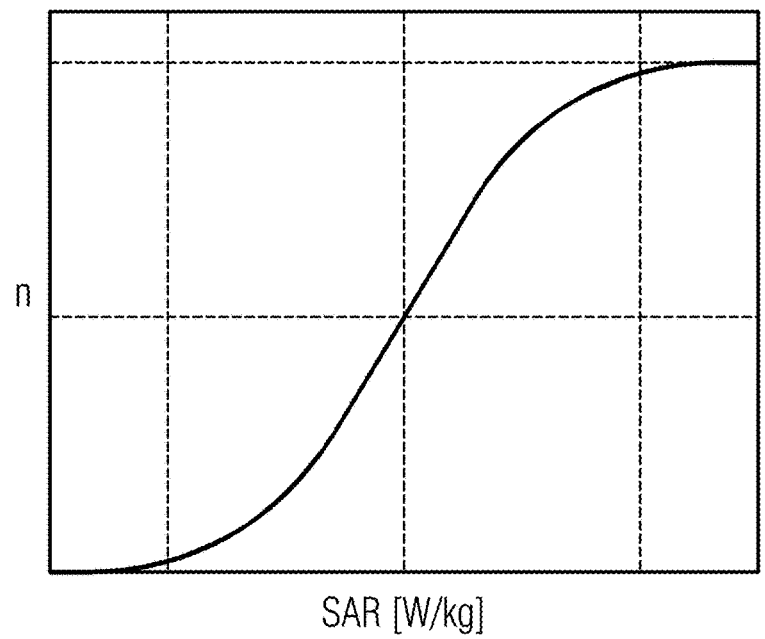
FIG. 3 schematically illustrates an example of a distribution function.

In act S3, a distribution function of the deposition values 5 may be determined from the frequency distribution by the control unit 9. The distribution function may describe a distribution function in the mathematical sense. For a particular deposition value 5, the distribution function may indicate a particular proportion n of the examined objects 6 for which a respective deposition value 5 was determined that is less than or equal to the particular deposition value 5. An example of a distribution function is shown in FIG. 3.

Figure 4:
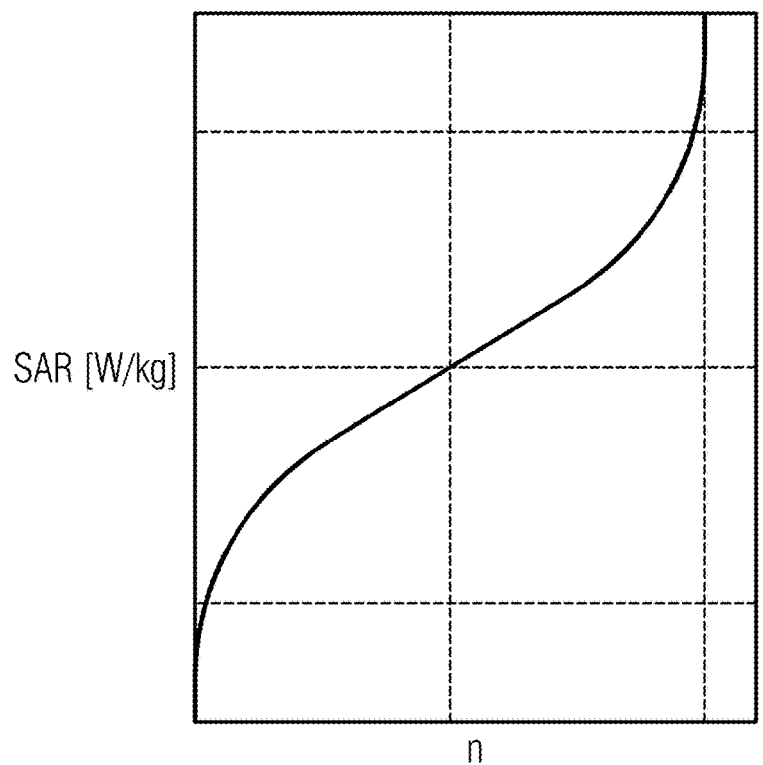
FIG. 4 schematically illustrates an example of an inverse distribution function.

In act S4, an inverse distribution function may be determined from the distribution function by the control unit 9. For a particular proportion 12 of the examined objects 6, the inverse distribution function may indicate the largest deposition value 5 at which the distribution function of the deposition values 5 exceeds a proportion 12. An example of a distribution function is shown in FIG. 4.

In act S5, the control unit 9 may receive a predefined reference proportion 12. The predefined reference proportion 12 may be provided, for example, by a user interface of the MRI apparatus 4. The control unit 9 may use the inverse distribution function to determine the largest deposition value 5 for the predefined reference proportion 12. The determined largest deposition value 5 may be defined by the control unit 9 as the reference deposition value 11.

In act S6, at least one MRI protocol parameter 10 of an MRI protocol for examining the object 8 may be determined by the control unit 9 in accordance with a predefined MRI protocol optimization procedure. The largest deposition value 5 may be used by the control unit 9 as the reference deposition value 11 in the MRI protocol optimization procedure.

In act S7, the MRI protocol including the at least one MRI protocol parameter 10 may be set by the control unit 9 in the MRI apparatus 4 in order to perform the MRI examination on the object 8 by the MRI apparatus 4.

FIG. 2 show a schematic representation of a frequency distribution.

In the method, for each MRI examination, characteristic object parameter values of the examined objects 6, such as the examination position, (e.g., heart), the weight value of the patient, and the deposition value 5 or SAR for each B1^2 value obtained for the patient for the reference pulse may be stored in a central memory by the MRI apparatus 4.

A frequency distribution of the SAR for each examination position and/or weight value may then be created from all the collected data. With a sufficiently large number, this distribution tends towards a Gaussian distribution. The characteristic object parameter values 7 (mean and variance) may then be fitted.

The diagram shows how often the respective deposition values 5 were determined. The frequency distribution shows the number of respective deposition values 5 for at least one object parameter value 7. The number is given in absolute values. The deposition values 5 in W/kg. A Gaussian curve is approximated to the individual values and shows the approximated values 13.

FIG. 2 shows a frequency distribution for a weight value of 77.5 kg+/−2.5 kg for a particular examination position.

FIG. 3 shows a schematic representation of a distribution function.

The distribution function defines, for example, how high the probability is that a particular reference deposition value 5 will not be exceeded for the patients in this weight category and with an examination at the predefined examination position. As the distribution function is based on patient data, this probability also corresponds to the relative proportion 12 of the population for which the deposition value 5 is not exceeded under the given conditions.

If the relative proportion 12 of the population for which the SAR is not exceeded is now defined, the maximum reference SAR and thus also the protocol SAR may be determined therefrom.

The proportion n of objects 6 whose deposition value 5 is below a certain deposition value 5 is shown.

FIG. 4 shows a schematic representation of an inverse distribution function.

If a specified proportion 12 of the population is defined for which the SAR is not exceeded, the maximum reference SAR and therefore also the protocol SAR may be determined therefrom.

This value may now be used to adjust the MRI protocol parameters 10 of the MRI protocol in such a way that an optimum ratio between image quality, runtime and resolution is achieved at maximum SAR exposure without having to interrupt the workflow for the defined proportion 12 of the population. It is conceivable that the value of the predefined proportion 12 of the population together with MRI protocol parameters 10 may be individually adjusted at a user interface of an MRI apparatus 4 and that the MRI protocol automatically adjusts its MRI protocol parameters 10 accordingly.

Conversely, in the case of an existing MRI protocol, it is possible to predetermine at which proportion 12 of the population that MRI protocol will run under the given boundary conditions without interrupting the workflow.

FIG. 5 schematically illustrates an MRI system.

The MRI system 1 may have a central storage unit 2. The central storage unit 2 may be configured to receive MRI examination datasets 3 from MRI apparatuses 4 and/or to provide the MRI examination datasets 3 to the MRI apparatuses 4. A respective one of the MRI examination datasets 3 may include a deposition value 5 that may have been determined during an MRI examination by an MRI apparatus 4 on an examined object 6. A respective one of the MRI examination datasets 3 may also include at least one object parameter value 7 possessed by the examined object 8. The object parameter value 7 may include a weight and/or an examination region of the object 6. In order to perform an MRI examination on an object 8, an MRI protocol for performing the MRI examination may be provided by the MRI apparatus 4. The MRI protocol may be provided by a control unit 9 of the MRI apparatus 4. In order to be able to optimize MRI protocol parameters 10 of the MRI protocol, an object parameter value 7 of the object 8 may be acquired by the control unit 9. The object parameter value 7 may be acquired by the MRI apparatus 4 or entered by an input device of the MRI apparatus 4.

The control unit 9 may be configured to transmit the at least one object parameter value 7 to the central storage unit 2 of the MRI system 1. The central storage unit 2 may be configured to transmit to the control unit 9 those deposition values 5 for the object parameter value 7 that were acquired for objects 6 having the object parameter value 7. The control unit 9 may be configured to generate, based on the received deposition values 5, a frequency distribution that may describe how often the respective deposition values 5 were determined for objects 6 having the predefined object parameter value 7.

The control unit 9 may be configured to determine a distribution function from the frequency distribution. The control unit 9 may be configured to determine an inverse distribution function from the distribution function. The control unit 9 may be configured to receive a predefined proportion 12. The predefined reference proportion 12 may describe a proportion 12 for which deposition values 5 were determined that are below a particular predefined deposition value 5. Using the inverse distribution function, the control unit 9 may determine the corresponding largest deposition value 5 as the reference deposition value 11.

In a predefined MRI protocol optimization procedure, the MRI protocol for performing the MRI examination may be executed in accordance with the reference deposition value 11 in order to determine or modify at least one MRI protocol parameter 10. The MRI apparatus 4 may be activated by the control unit 9 to examine the object 8 in accordance with the MRI protocol. The deposition value 5 determined for the object 8 and the object parameter value 7 may be supplied to an MRI examination dataset 3 and sent to the central storage unit 2 by the control unit 9.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method comprising:
receiving, by a control unit of a magnetic resonance imaging (MRI) system, at least one object parameter value of an object in an MRI examination in accordance with a predefined MRI protocol;
determining, by the control unit, a frequency distribution of deposition values of examined objects from available MRI examination datasets, each having the at least one object parameter value, wherein a respective MRI examination dataset of the MRI examination datasets comprises a respective deposition value and a respective object parameter value of a respective examined object;
determining, by the control unit, a reference deposition value of the examined objects from the frequency distribution of the deposition values of the examined objects for a predefined reference proportion in accordance with a predefined reference determining procedure of the MRI system; and
determining, by the control unit, at least one MRI protocol parameter of the predefined MRI protocol for examining the object having the object parameter value in accordance with a predefined MRI protocol optimization procedure as a function of the reference deposition value.

2. The method of claim 1, wherein the predefined reference determining procedure of the MRI system comprises:
determining, by the control unit from the frequency distribution, a distribution function of the deposition values of the examined objects having the at least one object parameter value;
determining, by the control unit, an inverse distribution function of the distribution function, wherein the inverse distribution function assigns a largest deposition value to a proportion of the examined objects that have the at least one object parameter value at which the distribution function of the deposition values exceeds the proportion;
determining, by the control unit, the largest deposition value for the predefined reference proportion by the inverse distribution function; and
determining, by the control unit, the largest deposition value for the predefined reference proportion as the reference deposition value.

3. The method of claim 1, wherein the deposition values of the examined objects describe specific absorption rate (SAR) values.

4. The method of claim 1, wherein the deposition values of the examined objects describe $B_1+^2$ values.

5. The method of claim 1, wherein the at least one object parameter value comprises a mass of the object.

6. The method of claim 1, wherein the at least one object parameter value comprises a position of an examination region of the object.

7. The method of claim 1, further comprising:
receiving, by the control unit, the predefined reference proportion.

8. The method of claim 7, further comprising:
retrieving, by the control unit, the deposition values of the examined objects having the at least one object parameter value from a storage unit of the MRI system.

9. The method of claim 8, further comprising:
activating, by the control unit, an MRI apparatus to examine the object by the MRI apparatus in accordance with the MRI protocol.

10. The method of claim 9, further comprising:
determining, by the control unit, the respective deposition value of the object;
creating, by the control unit, the respective MRI examination dataset comprising the respective deposition value and the respective object parameter value of the object; and
transmitting, by the control unit, the respective MRI examination dataset to the storage unit.

11. The method of claim 1, further comprising:
retrieving, by the control unit, the deposition values of the examined objects having the at least one object parameter value from a storage unit of the MRI system.

12. The method of claim 1, further comprising:
activating, by the control unit, an MRI apparatus to examine the object by the MRI apparatus in accordance with the MRI protocol.

13. The method of claim 12, further comprising:
determining, by the control unit, the respective deposition value of the object;
creating, by the control unit, the respective MRI examination dataset comprising the respective deposition value and the respective object parameter value of the object; and
transmitting, by the control unit, the respective MRI examination dataset to a storage unit.

14. A magnetic resonance imaging (MRI) system comprising:
at least one control unit configured to:
receive at least one object parameter value of an object in an MRI examination in accordance with a predefined MRI protocol;
determine a frequency distribution of deposition values of examined objects from available MRI examination datasets, each having the at least one object parameter value, wherein a respective MRI examination dataset of the MRI examination datasets comprises a respective deposition value and a respective object parameter value of a respective examined object;
determine a reference deposition value of the examined objects from the frequency distribution of the deposition values of the examined objects for a predefined reference proportion in accordance with a predefined reference determining procedure; and
determine, as a function of the reference deposition value, at least one MRI protocol parameter of the predefined MRI protocol for examining the object having the object parameter value in accordance with a predefined MRI protocol optimization procedure.

15. A control unit of a magnetic resonance imaging (MRI) system, wherein the control unit is configured to:
   receive at least one object parameter value of an object in an MRI examination in accordance with a predefined MRI protocol;
   determine a frequency distribution of deposition values of examined objects from available MRI examination datasets, each having the at least one object parameter value, wherein a respective MRI examination dataset of the MRI examination datasets comprises a respective deposition value and a respective object parameter value of a respective examined object;
   determine a reference deposition value of the examined objects from the frequency distribution of the deposition values of the examined objects for a predefined reference proportion in accordance with a predefined reference determining procedure; and
   determine, as a function of the reference deposition value, at least one MRI protocol parameter of the predefined MRI protocol for examining the object having the object parameter value in accordance with a predefined MRI protocol optimization procedure.

* * * * *